(12) United States Patent
Zhou et al.

(10) Patent No.: US 11,817,502 B2
(45) Date of Patent: Nov. 14, 2023

(54) THREE-DIMENSIONAL FIELD EFFECT DEVICE

(71) Applicant: INTERNATIONAL BUSINESS MACHINES CORPORATION, Armonk, NY (US)

(72) Inventors: Huimei Zhou, Albany, NY (US); Su Chen Fan, Cohoes, NY (US); Shogo Mochizuki, Mechanicville, NY (US); Peng Xu, Santa Clara, CA (US); Nicolas J. Loubet, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 192 days.

(21) Appl. No.: 17/569,133

(22) Filed: Jan. 5, 2022

(65) Prior Publication Data

US 2022/0130992 A1    Apr. 28, 2022

Related U.S. Application Data

(62) Division of application No. 16/592,455, filed on Oct. 3, 2019, now Pat. No. 11,222,981, which is a division of application No. 15/979,589, filed on May 15, 2018, now Pat. No. 10,490,667.

(51) Int. Cl.
*H01L 29/76* (2006.01)
*H01L 29/94* (2006.01)
*H01L 31/062* (2012.01)
(Continued)

(52) U.S. Cl.
CPC ........ *H01L 29/785* (2013.01); *H01L 27/0688* (2013.01); *H01L 27/0924* (2013.01); *H01L 29/0847* (2013.01); *H01L 29/66795* (2013.01)

(58) Field of Classification Search
CPC .............. H01L 29/785; H01L 27/0688; H01L 27/0924; H01L 29/0847; H01L 29/66795;
(Continued)

(56) References Cited

U.S. PATENT DOCUMENTS 5,610,085 A    3/1997   Yuan et al.
7,804,137 B2   9/2010   Kang et al.
(Continued)

OTHER PUBLICATIONS

Office Action issued in corresponding U.S. Appl. No. 16/592,389 dated May 11, 2021 (11 pages).
(Continued)

*Primary Examiner* — Theresa T Doan
(74) *Attorney, Agent, or Firm* — Tutunjian & Bitetto, P.C.; Samuel Waldbaum

(57) ABSTRACT

A method of forming stacked fin field effect devices is provided. The method includes forming a layer stack on a substrate, wherein the layer stack includes a first semiconductor layer on a surface of the substrate, a second semiconductor layer on the first semiconductor layer, a third semiconductor layer on the second semiconductor layer, a separation layer on the third semiconductor layer, a fourth semiconductor layer on the separation layer, a fifth semiconductor layer on the fourth semiconductor layer, and a sixth semiconductor layer on the fifth semiconductor layer. The method further includes forming a plurality of channels through the layer stack to the surface of the substrate, and removing portions of the second semiconductor layer and fifth semiconductor layer to form lateral grooves.

20 Claims, 9 Drawing Sheets

(51) Int. Cl.
  *H01L 29/78*   (2006.01)
  *H01L 29/66*   (2006.01)
  *H01L 27/092*  (2006.01)
  *H01L 27/06*   (2006.01)
  *H01L 29/08*   (2006.01)

(58) Field of Classification Search
  CPC ......... H01L 21/8221; H01L 21/823828; H01L 21/823885; H01L 27/092; H01L 29/41733; H01L 29/42384; H01L 29/78642
  USPC ........................................................ 257/401
  See application file for complete search history.

(56) References Cited

U.S. PATENT DOCUMENTS

| | | | |
|---|---|---|---|
| 8,445,347 B2 | 5/2013 | Alsmeier | |
| 9,000,409 B2 | 4/2015 | Huo et al. | |
| 9,659,963 B2 | 5/2017 | Cheng et al. | |
| 9,680,473 B1 | 6/2017 | Anderson et al. | |
| 9,824,933 B1 | 11/2017 | Pawlak | |
| 2006/0261406 A1 | 11/2006 | Chen | |
| 2010/0112769 A1 | 5/2010 | Son et al. | |
| 2016/0043074 A1 | 2/2016 | Hurley et al. | |
| 2016/0056169 A1* | 2/2016 | Lee ........................ | H10B 99/00 438/269 |
| 2017/0025412 A1 | 1/2017 | Jun et al. | |
| 2017/0084618 A1* | 3/2017 | Peri ........................ | H10B 43/35 |
| 2017/0213900 A1 | 7/2017 | Cheng et al. | |
| 2017/0263749 A1 | 9/2017 | Chang et al. | |
| 2020/0058761 A1 | 2/2020 | Ho et al. | |

OTHER PUBLICATIONS

List of IBM Patents or Patent Applications Treated as Related dated Jan. 5, 2022, 2 pages.

* cited by examiner

THREE-DIMENSIONAL FIELD EFFECT DEVICE

BACKGROUND

Technical Field

The present invention generally relates to field effect transistors, and more particularly to forming an arrangement of two or more field effect transistors.

Description of the Related Art

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a MOSFET with a single gate parallel with the plane of the substrate. Depending on the doping of the source and drain, an n-FET or a p-FET can be formed.

Examples of FETs can include a metal-oxide-semiconductor field effect transistor (MOSFET) and an insulated-gate field-effect transistor (IGFET). Two FETs also can be coupled to form a complementary metal oxide semiconductor (CMOS) device, where a p-channel MOSFET and n-channel MOSFET are coupled together.

SUMMARY

In accordance with an embodiment of the present invention, a method of forming stacked fin field effect devices is provided. The method includes forming a layer stack on a substrate, wherein the layer stack includes a first semiconductor layer on a surface of the substrate, a second semiconductor layer on the first semiconductor layer, a third semiconductor layer on the second semiconductor layer, a separation layer on the third semiconductor layer, a fourth semiconductor layer on the separation layer, a fifth semiconductor layer on the fourth semiconductor layer, and a sixth semiconductor layer on the fifth semiconductor layer. The method further includes forming a plurality of channels through the layer stack to the surface of the substrate, and removing portions of the second semiconductor layer and fifth semiconductor layer to form lateral grooves.

In accordance with another embodiment of the present invention, a method of forming stacked fin field effect devices is provided. The method includes forming one or more channels through a first semiconductor layer, a second semiconductor layer, a third semiconductor layer, a separation layer, a fourth semiconductor layer, a fifth semiconductor layer, and a sixth semiconductor layer to a top surface of a substrate. The method further includes removing portions of the second semiconductor layer and fifth semiconductor layer to form lateral grooves, and forming a gate structure in each of the lateral grooves.

In accordance with yet another embodiment of the present invention, a stacked field effect device is provided. The stacked field effect device includes a lower vertical transport field effect transistor segment, an upper vertical transport field effect transistor co-linear with the lower vertical transport field effect transistor, and an insulating layer between the upper vertical transport field effect transistor segment and the lower vertical transport field effect transistor segment.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention relate generally to forming multiple vertical transport field effect transistors (VT FETs) stacked on top of each other to increase device density, while making the fabrication process more efficient by reducing the number of masking and etching processes involved in forming multiple devices.

Embodiments of the present invention relate generally to forming three-dimensional (3-D) field effect devices through forming multiple co-linear vertical pillars with source/drains, and forming conductive lines orthogonal to the vertical pillars as a unified process to produce multiple vertical transport field effect transistors. The conductive lines can be formed in electrical connection with the source/drains or as part of an electrode of a gate structure by removing bars of the same material layer adjoining the vertical pillars. The vertical pillars can be semiconductor material, whereas the conductive lines can be a metal or metal alloy. The device channels and top and bottom source/drains can be formed from the adjoining layers of a stack of semiconductor layers.

Embodiments of the present invention relate generally to forming n-type FETs and p-type FETs stacked on top of each other by alternating n-doped and p-doped layers in a semiconductor layer stack for forming multiple VT FETs. Different regions of a substrate can have different orders of alternating n-doped and p-doped layers, such that a different sequence of n-type and p-type VT FETs can be formed on different regions of the substrate. The stacked n-type and p-type VT FETs can form CMOS devices.

Embodiments of the present invention relate generally to forming source/drains above and/or below device channels by alternating the epitaxial growth and dopant type and dopant concentration when forming the semiconductor layers for the vertical pillars of the multiple VT FETs. Conductive lines can be formed to the different doped layers to form the VT FET source and drain connections and the gate electrodes, where the conductive lines can span multiple source/drains or gate structures.

Exemplary applications/uses to which the present invention can be applied include, but are not limited to: complementary metal-oxide-semiconductor (CMOS) devices for logic circuits (e.g., NAND gates, NOR gates, etc.) and memories (e.g., flip-flops, static random access memory (SRAM), dynamic random access memory (DRAM), electrically erasable programmable read-only memory (EEPROM), etc.), and application specific integrated circuits (ASICs).

It is to be understood that aspects of the present invention will be described in terms of a given illustrative architecture; however, other architectures, structures, substrate materials and process features and steps can be varied within the scope of aspects of the present invention.

Figure 1:
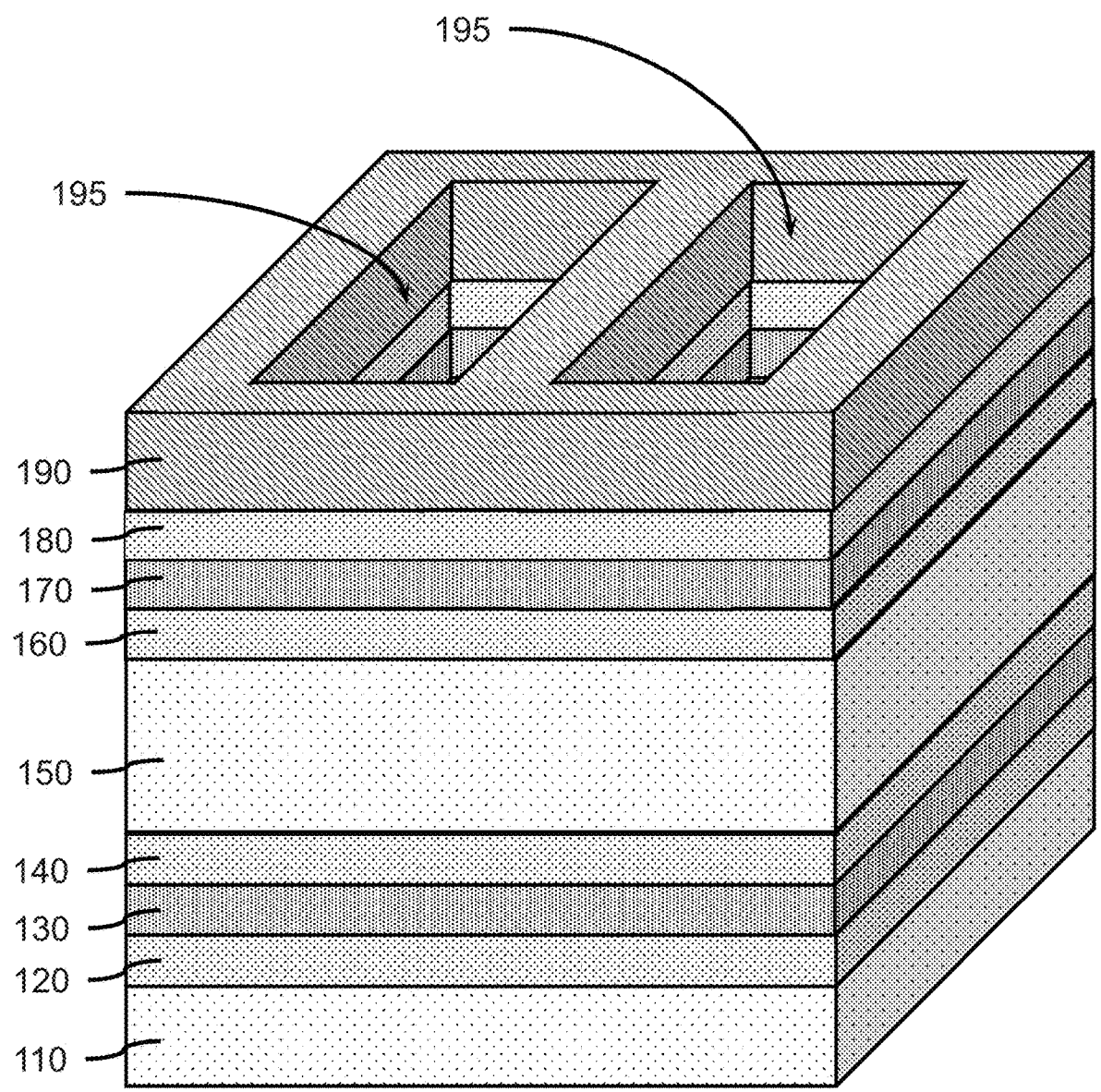
FIG. 1 is a three-dimensional view showing a patterned mask layer on a semiconductor layer stack, in accordance with an embodiment of the present invention.

Referring now to the drawings in which like numerals represent the same or similar elements and initially to FIG. 1, a patterned mask layer on a semiconductor layer stack is shown, in accordance with an embodiment of the present invention.

In one or more embodiments, a substrate 110 can be, for example, a single crystal semiconductor material wafer or a semiconductor-on-insulator stacked wafer. The substrate 110 can include a support layer that provides structural support, and an active semiconductor layer that can form devices. An insulating layer (e.g., a buried oxide (BOX) layer) may be between the active semiconductor layer and the support layer to form a semiconductor-on-insulator substrate (SeOI) (e.g., a silicon-on-insulator substrate (SOI)), or an implanted layer can form a buried insulating material.

The support layer can include crystalline, semi-crystalline, micro-crystalline, nano-crystalline, and/or amorphous phases. The support layer can be a semiconductor (e.g., silicon (Si), silicon carbide (SiC), silicon-germanium (SiGe), germanium (Ge), gallium-arsenide (GaAs), cadmium-telluride (CdTe), etc.), an insulator (e.g.: glass (e.g. silica, borosilicate glass), ceramic (e.g., aluminum oxide ($Al_2O_3$, sapphire), plastic (e.g., polycarbonate, polyacetonitrile), metal (e.g. aluminum, gold, titanium, molybdenum-copper (MoCu) composites, etc.), or combination thereof.

The wafer or active semiconductor layer can include a crystalline, semi-crystalline, micro-crystalline, nano-crystalline, and/or amorphous semiconductor, for example, a IV or IV-IV semiconductor (e.g., silicon (Si), silicon carbide (SiC), silicon-germanium (SiGe), germanium (Ge)), a III-V semiconductor (e.g., gallium-arsenide (GaAs), indium-phosphide (InP), indium-antimonide (InSb)), a II-VI semiconductor (e.g., cadmium-telluride (CdTe), zinc-telluride (ZnTe), zinc sulfide (ZnS), zinc selenide (ZnSe)), or a IV-VI semiconductor (e.g., tin sulfide (SnS), lead selenide (PbSb)).

The surface of the substrate 110 can have a crystalline face on which additional layers can be epitaxially grown/deposited, for example, a silicon {100} crystal face.

In one or more embodiments, a first semiconductor layer 120 can be formed on the surface of the substrate 110, where the first semiconductor layer 120 can be formed by epitaxial or heteroepitaxial growth on the exposed surface of the substrate 110. Epitaxy and heteroepitaxy can be done by ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), molecular beam epitaxy (MBE). Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial silicon, silicon germanium (SiGe), carbon doped silicon (Si:C) and/or silicon carbide (SiC) can be doped during deposition (in-situ doped) by adding dopants, n-type dopants (e.g., phosphorus or arsenic) or p-type dopants (e.g., boron or gallium), depending on the type of device being fabricated (e.g., n-type or p-type). The terms "epitaxial growth and/or deposition" and "epitaxially formed and/or grown," relates to the growth of a crystalline material on a deposition surface of another crystalline material, in which the material being formed (also referred to as a crystalline over layer) has substantially the same crystalline characteristics as the material of the deposition surface (e.g., seed material). Heteroepitaxy refers to epitaxial growth of a material with a different chemical composition than the seed material on the deposition surface.

In various embodiments, the in-situ doping can be controlled to form layers alternating between n-type dopants, no dopants (i.e., intrinsic), and p-type dopants, to form top and bottom source/drains with an intrinsic semiconductor device channel layer in between the source/drain layers. At least six semiconductor layers can be epitaxially/heteroepitaxially grown on each other to form the semiconductor layer stack. The sequence of doped and undoped layers with a separation layer in between can be repeated to form additional devises stacked on top of one another.

In one or more embodiments, the first semiconductor layer 120 can be a semiconductor material, including, but not limited to, silicon (Si), silicon-germanium (SiGe), carbon-doped silicon (Si:C), silicon carbide (SiC), gallium nitride (GaN), gallium arsenide (GaAs), molybdenum sulfide (MoS), or a combination thereof.

In various embodiments, the first semiconductor layer 120 can be n-doped or p-doped to form a bottom source/drain.

In one or more embodiments, the first semiconductor layer 120 can have a thickness in a range of about 10 nanometers (nm) to about 20 nm, or in a range of about 12 nm to about 15 nm, although other thicknesses are also contemplated. The thickness of the first semiconductor layer 120 can determine the thickness (length) of a subsequently formed bottom source/drain for a lower VT FET.

In one or more embodiments, a second semiconductor layer 130 can be formed on the surface of the first semiconductor layer 120, wherein the second semiconductor layer 130 can be formed by epitaxial or heteroepitaxial growth (e.g., MBE, VPE, LPCVD, etc.).

In various embodiments, the second semiconductor layer 130 may not be doped. The second semiconductor layer 130 can provide an intrinsic semiconductor layer between subsequently formed doped semiconductor layers to form a lower VT FET device channel.

In one or more embodiments, the second semiconductor layer 130 can have a thickness in a range of about 10 nm to about 30 nm, or in a range of about 15 nm to about 25 nm, although other thicknesses are also contemplated. The thickness of the second semiconductor layer 130 can determine the length of a subsequently formed device channel for a lower VT FET.

In one or more embodiments, the second semiconductor layer 130 can be can be a semiconductor material, including, but not limited to, silicon (Si), silicon-germanium (SiGe), carbon-doped silicon (Si:C), silicon carbide (SiC), gallium nitride (GaN), gallium arsenide (GaAs), molybdenum sulfide (MoS), or a combination thereof. The second semiconductor layer 130 can be a different semiconductor material than the first semiconductor layer 120, where the second semiconductor layer 130 can have a different chemical composition/different chemical concentrations than the first semiconductor layer 120.

In one or more embodiments, a third semiconductor layer 140 can be formed on the surface of the second semiconductor layer 130, wherein the third semiconductor layer 140 can be formed by epitaxial or heteroepitaxial growth (e.g., MBE, VPE, LPCVD, etc.). The first semiconductor layer 120, second semiconductor layer 130, and third semiconductor layer 140 can have the same crystal structure and orientation as the substrate 110 through the epitaxial/heteroepitaxial growth process.

In one or more embodiments, the third semiconductor layer 140 can be a semiconductor material, including, but not limited to, silicon (Si), silicon-germanium (SiGe), carbon-doped silicon (Si:C), or silicon carbide (SiC), gallium nitride (GaN), gallium arsenide (GaAs), molybdenum sulfide (MoS), or a combination thereof. The third semiconductor layer 140 can be a different semiconductor material than the second semiconductor layer 130, where the third semiconductor layer 140 can have a different chemical composition/different chemical concentrations than the second semiconductor layer 130. The first semiconductor layer 120 and third semiconductor layer 140 may be the same semiconductor material, and may have the same doping type (n-type or p-type). In various embodiments, the third semiconductor layer 140 can be n-doped or p-doped to form a top source/drain.

In one or more embodiments, the third semiconductor layer 140 can have a thickness in a range of about 10 nm to about 20 nm, or in a range of about 12 nm to about 15 nm, although other thicknesses are also contemplated. The thickness of the third semiconductor layer 140 can determine the thickness (length) of a subsequently formed top source/drain for a lower VT FET.

In one or more embodiments, a separation layer 150 can be formed on the surface of the third semiconductor layer 140, wherein the separation layer 150 can be formed by expitaxy or heteroepitaxy. The use of expitaxy and/or heteroepitaxy can maintain the crystallinity and crystal orientation of each of the semiconductor layers formed for the stack.

In one or more embodiments, the separation layer 150 can have a thickness in a range of about 20 nm to about 50 nm, or in a range of about 30 nm to about 40 nm, although other thicknesses are also contemplated. The separation layer 150 can provide a sacrificial layer for later replacement by an insulating layer between vertically adjacent source/drains and gates of a VT FET.

In one or more embodiments, the separation layer 150 can be a semiconductor material, including, but not limited to, silicon (Si), silicon-germanium (SiGe), silicon carbide (SiC), gallium nitride (GaN), gallium arsenide (GaAs), molybdenum sulfide (MoS), or a combination thereof. The separation layer 150 can be a different material from the third semiconductor layer 140, the second semiconductor layer 130, and/or the first semiconductor layer 120 to allow selective removal.

In one or more embodiments, a fourth semiconductor layer 160 can be formed on the surface of the separation layer 150, where the fourth semiconductor layer 160 can be formed by epitaxy or heteroepitaxy.

In one or more embodiments, the fourth semiconductor layer 160 can have a thickness in a range of about 10 nm to about 20 nm, or in a range of about 12 nm to about 15 nm, although other thicknesses are also contemplated. The thickness of the fourth semiconductor layer 160 can determine the thickness of a subsequently formed bottom source/drain for an upper VT FET.

In one or more embodiments, the fourth semiconductor layer 160 can be a semiconductor material, including, but not limited to, silicon (Si), silicon-germanium (SiGe), carbon-doped silicon (Si:C), or silicon carbide (SiC), gallium nitride (GaN), gallium arsenide (GaAs), molybdenum sulfide (MoS), or a combination thereof.

In various embodiments, the fourth semiconductor layer 160 can be doped with a dopant of the opposite type from the first semiconductor layer 120 and third semiconductor layer 130 (i.e., an n-type dopant instead of a p-type dopant, or vice versa).

In one or more embodiments, a fifth semiconductor layer 170 can be formed on the fourth semiconductor layer 160, where the fifth semiconductor layer 170 can be formed by epitaxy or heteroepitaxy.

In one or more embodiments, the fifth semiconductor layer 170 can be a semiconductor material, including, but not limited to, silicon (Si), silicon-germanium (SiGe), carbon-doped silicon (Si:C), or silicon carbide (SiC), gallium nitride (GaN), gallium arsenide (GaAs), molybdenum sulfide (MoS), or a combination thereof. The fifth semiconductor layer 170 can be a different semiconductor material than the fourth semiconductor layer 160, where the fifth semiconductor layer 170 can have a different chemical composition/different chemical concentrations than the fourth semiconductor layer 160.

In various embodiments, the fifth semiconductor layer 170 may not be doped. The fifth semiconductor layer 170 can provide an intrinsic semiconductor layer between doped semiconductor layers to form an upper VT FET device channel.

In one or more embodiments, the fifth semiconductor layer 170 can have a thickness in a range of about 10 nm to about 30 nm, or in a range of about 15 nm to about 25 nm, although other thicknesses are also contemplated. The thickness of the fifth semiconductor layer 170 can determine the length of a subsequently formed device channel for an upper VT FET.

In one or more embodiments, a sixth semiconductor layer 180 can be formed on the surface of the fifth semiconductor layer 170, where the sixth semiconductor layer 180 can be formed by epitaxy or heteroepitaxy.

In one or more embodiments, the sixth semiconductor layer 180 can be a semiconductor material, including, but not limited to, silicon (Si), silicon-germanium (SiGe), carbon-doped silicon (Si:C), or silicon carbide (SiC), gallium nitride (GaN), gallium arsenide (GaAs), molybdenum sulfide (MoS), or a combination thereof. The sixth semiconductor layer 180 can be a different semiconductor material than the fifth semiconductor layer 170, where the sixth semiconductor layer 180 can have a different chemical composition/different chemical concentrations than the fifth semiconductor layer 170. The sixth semiconductor layer 180 and fourth semiconductor layer 160 may be the same semiconductor material, and may have the same doping type (n-type or p-type). In various embodiments, the sixth semiconductor layer 180 can be n-doped or p-doped to form a top source/drain.

In one or more embodiments, the sixth semiconductor layer 180 can have a thickness in a range of about 10 nm to about 20 nm, or in a range of about 12 nm to about 15 nm, although other thicknesses are also contemplated. In various embodiments, the sixth semiconductor layer 180 can be n-doped or p-doped to form a top source/drain for an upper VT FET device.

In one or more embodiments, additional sequences of the separation layer and semiconductor layers can be formed on top of the sixth semiconductor layer 180 to provide a suitable layer stack for forming a predetermined number of additional stacked VT FET devices. The separation layer can be formed between each pair of adjacent doped semiconductor layers to separate the stacked devices.

In various embodiments, the semiconductor layers can be silicon-germanium with different concentrations of germanium to control the etch rates of each layer, so different semiconductor layers can be selectively removed. Selective removal refers to the ability to remove one material without notably effecting other materials due to differences in etch rate and/or etch chemistry. In various embodiments, the semiconductor layers 130, 170 intended to form device channels in the vertical pillars can have a greater germanium concentration than the semiconductor layers 120, 140, 160, 180 intended to form top and bottom source/drains, where the germanium concentration of semiconductor layers 130, 170 can be from about 10 atomic percent (at. %) to about 90 at. %, or about 20 at. % to about 90 at. %, or about 50 at. % to about 90 at. %, or about 20 at. % to about 80 at. %, or about 60 at. % to about 80 at. %, although other concentrations are also contemplated. The germanium concentration of the semiconductor layers 120, 140, 160, 180 can be from about 1 atomic percent (at. %) to about 80 at. %, or about 2 at. % to about 60 at. %, or about 10 at. % to about 50 at. %, or about 5 at. % to about 40 at. %, or about 10 at. % to about 30 at. %, although other concentrations are also contemplated, where the germanium concentration of the semiconductor layers 120, 140, 160, 180 is lower than the germanium concentration of the semiconductor layers 130, 170. In various embodiments, the semiconductor layers 130, 170 can be 100 at. % germanium.

In a non-limiting exemplary embodiment, semiconductor layers 120, 140, 160, 180 can have a germanium concentration of about 25 at. % and semiconductor layers 130, 170 can have a germanium concentration of about 55 at. %.

In various embodiments, semiconductor layers intended to form n-type source/drains can be silicon (Si), carbon-doped silicon (Si:C) or silicon carbide (SiC), and the semiconductor layers intended to form p-type source/drains can be silicon (Si) or silicon-germanium (SiGe).

In one or more embodiments, a lithographic mask layer 190 can be formed on the sixth semiconductor layer 180, where the lithographic mask layer 190 can be blanket deposited, for example, by chemical vapor deposition (CVD), plasma enhance CVD (PECVD), or spin-on. The lithographic mask layer 190 can be a hardmask, a softmask, or a combination thereof. A hardmask can be a dielectric material. A soft mask can be a polymeric resist material that can be patterned and developed through a lithographic process, and the pattern transferred to underlying layers including the hardmask.

In one or more embodiments, the lithographic mask layer 190 can be patterned and developed to form a plurality of openings 195 that exposes portions of the sixth semiconductor layer 180, where the pattern of openings 195 can be transferred to the underlying layers by etching to form channels. The openings 195 can form a row×column array. The size of the openings can determine the lateral (i.e., parallel to the plane of the substrate) length of subsequently formed device features.

Figure 2:
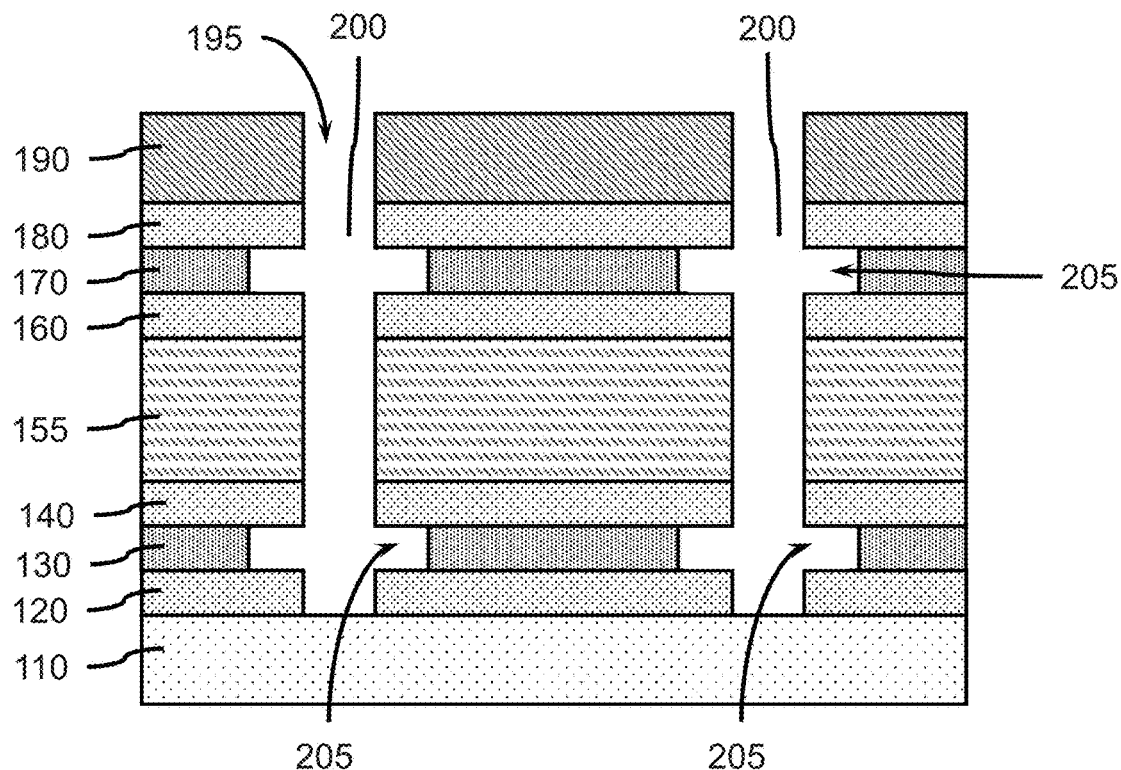
FIG. 2 is a cross-sectional side view showing a plurality of channels formed in the semiconductor layer stack, and selective removal of a portion of some of the semiconductor layers to form lateral grooves, in accordance with an embodiment of the present invention.

FIG. 2 is a cross-sectional side view showing a plurality of channels formed in the semiconductor layer stack, and selective removal of a portion of some of the semiconductor layers, in accordance with an embodiment of the present invention.

In one or more embodiments, portions of the sixth semiconductor layer 180 exposed by openings 195 in lithographic mask layer 190 and portions of the underlying layers 170, 160, 150, 140, 130, 120 can be removed using a non-selective, directional etch, or a sequence of selective directional etches (e.g., reactive ion etch (RIE)) for each of the materials of the underlying layers to form channels 200 through the semiconductor layers down to the surface of the substrate 110.

In one or more embodiments, channels 200 can have a width in a range of about 10 nm to about 30 nm, or about 15 nm to about 25 nm, although other widths are contemplated.

In one or more embodiments, channels 200 can have a length in a range of about 10 nm to about 100 nm, or about 40 nm to about 75 nm, although other lengths are contemplated. The length of the channels 200 can determine the length of grooves and recesses formed in the underlying layers that can be used to form gate structures and source/drain contacts.

The Height/Width aspect ratio of channels can be about 4.5 or up to 4.5, which depends on the stacked vertical device number and selective process margin.

In one or more embodiments, the separation layer 150 can be removed and replaced with an insulating layer 155, where the insulating layer 155 can be formed, for example, by ALD, PEALD, CVD, PECVD, or a combination thereof. Portions of the semiconductor layer stack around the periphery of each channel 200 can support the semiconductor layers 160, 170, 180, and lithographic mask layer 190 while the portion of the separation layer 150 is removed and replaced with insulating layer 155. The process can be repeated until the exposed portion of the separation layer 150 is replaced and the channels 200 are reopened down to the substrate surface.

In one or more embodiments, a portion of the second semiconductor layer 130 and a portion of the fifth semiconductor layer 170 can be the same material, which can have essentially the same elemental composition (e.g., $Si_xGe_{1-x}$), so portions of the semiconductor layers 130, 170 can be removed at the same time. A portions of the second semiconductor layer 130 and a portion of the fifth semiconductor layer 170 can be removed using a selective isotropic etch, (e.g., wet chemical etch, dry plasma etch) to form lateral grooves 205 in the second semiconductor layer 130 and fifth semiconductor layer 170. The grooves 205 can extend along the length of the channel 200, and may extend beyond the ends of the channels 200.

In one or more embodiments, the lateral grooves 205 can be formed to a depth of about 10 nm to about 30 nm into the second semiconductor layer 130 and fifth semiconductor layer 170.

Figure 3:
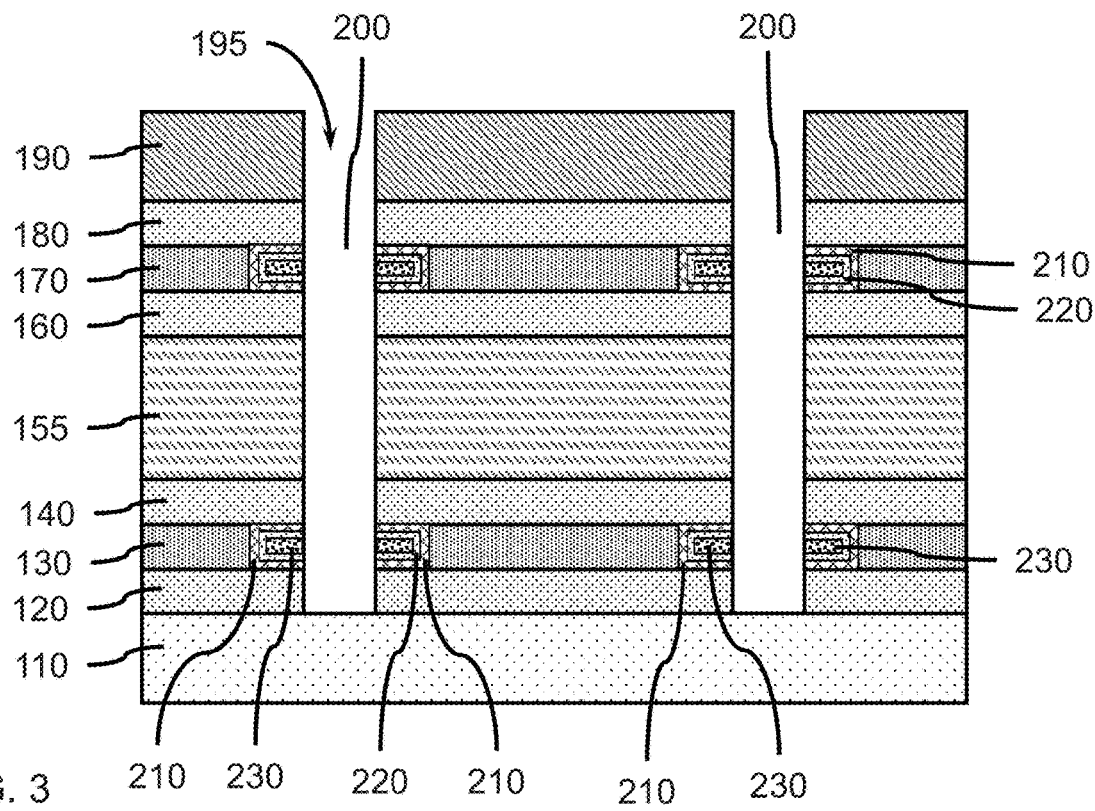
FIG. 3 is a cross-sectional side view showing formation of gate structures in each of the lateral grooves formed in the semiconductor layers, in accordance with an embodiment of the present invention.

FIG. 3 is a cross-sectional side view showing formation of gate structures in each of the lateral grooves formed in the semiconductor layers, in accordance with an embodiment of the present invention.

In one or more embodiments, a gate structure can be formed in each of the lateral grooves 205. A gate structure can include a gate dielectric layer 210, a work function layer 220, and a gate fill layer 230.

In one or more embodiments, a gate dielectric layer 210 can be formed on the exposed portions of the second semiconductor layer 130 and fifth semiconductor layer 170, and exposed surfaces of the adjacent first semiconductor layer 120 and third semiconductor layer 140, or the adjacent fourth semiconductor layer 160 and sixth semiconductor layer 180, and a work function layer 220 can be formed on the gate dielectric layer, where the gate dielectric layer 210 and work function layer 220 can be formed by conformal depositions (e.g., atomic layer deposition (ALD) or plasma enhanced ALD (PEALD)).

In one or more embodiments, a gate dielectric layer 210 can be silicon oxide (SiO), silicon nitride (SiN), silicon oxynitride (SiON), boron nitride (BN), high-k dielectric materials, or a combination thereof. Examples of high-k materials include but are not limited to metal oxides, such as, hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZnNbO). The high-k material may further include dopants such as lanthanum, aluminum, magnesium, or combinations thereof.

In various embodiments, the gate dielectric layer 210 can have a thickness in the range of about 7 Å to about 30 Å, or about 7 Å to about 10 Å, or about 1 nm to about 2 nm, although other thicknesses are contemplated.

In various embodiments, the work function layer 220 can include, but not necessarily be limited to, titanium nitride (TiN), tantalum nitride (TaN) or ruthenium (Ru), for a PFET. The work function layer 220 can include, but not necessarily be limited to, titanium nitride (TiN), titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN), lanthanum (La) doped TiN or lanthanum (La) doped TaN, for an NFET. The work function material (WFM) can form the work function layer 220 on the gate dielectric layer 210.

The work function layer 220 can have a thickness in the range of about 1 nm to about 10 nm, or about 2 nm to about 5 nm, or about 1 nm to about 3 nm, or about 2 nm, although other thicknesses are contemplated.

In one or more embodiments, a gate fill layer 230 can be formed on the gate dielectric layer 210 and work function layer 220, where the gate fill layer 230 can be formed by a conformal deposition (e.g., ALD).

In various embodiments, the gate fill layer 230 can be made of a conductive material, which can be a metal, for example, tungsten (W), copper (Cu), cobalt (Co), tantalum (Ta), titanium (Ti), manganese (Mn); a conductive metal compound, for example, tantalum nitride (TaN), titanium nitride (TiN), titanium carbide (TiC), a copper manganese alloy (Cu—Mn), or any suitable combination thereof.

An etch back can be used to remove deposited gate fill layer 230, work function layer 220, and/or gate dielectric layer 210 materials from the channel 200. Excess gate dielectric layer 210 material, work function layer 220 material, and gate fill layer 230 material deposited on the sidewalls of the channel 200 formed by the other surfaces can be removed using an isotropic etch and/or RIE.

Figure 4:
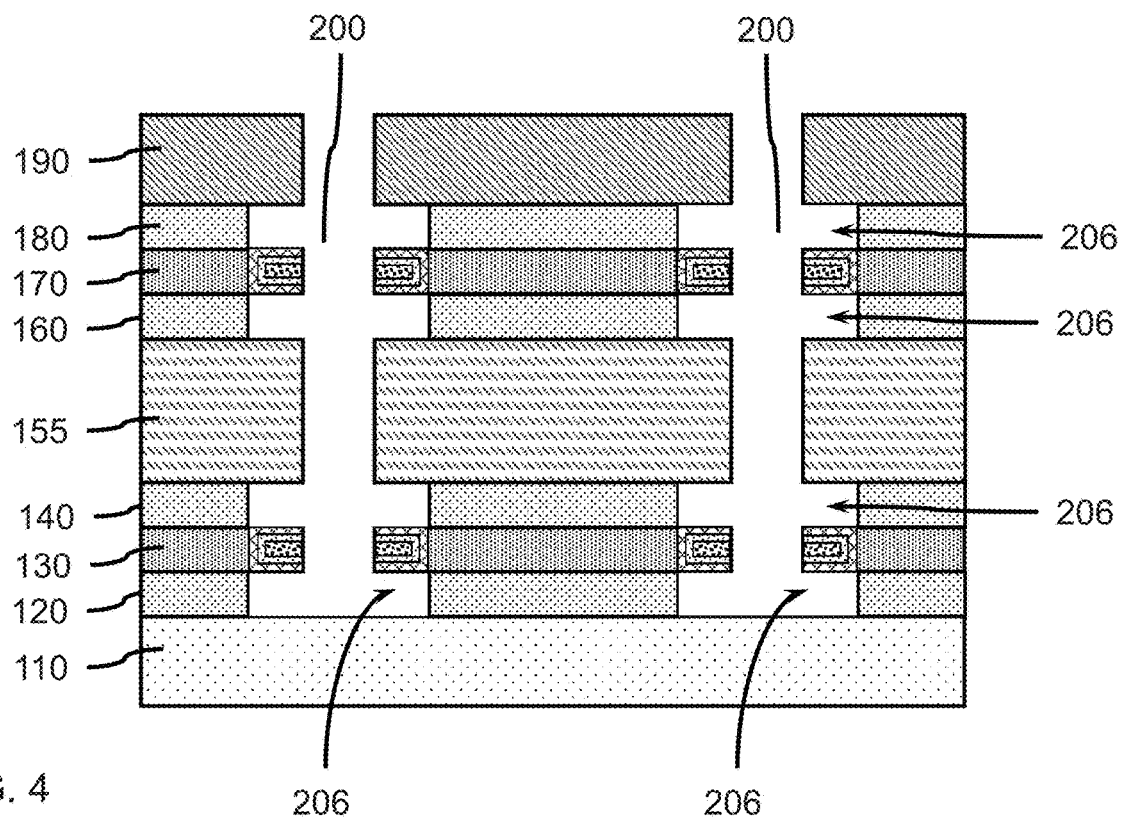
FIG. 4 is a cross-sectional side view showing selective removal of portions of other layers of the semiconductor layer stack adjacent to the gate structures, in accordance with an embodiment of the present invention.

FIG. 4 is a cross-sectional side view showing selective removal of portions of other layers of the semiconductor layer stack adjacent to the gate structures, in accordance with an embodiment of the present invention.

In one or more embodiments, portions of the first semiconductor layer 120, third semiconductor layer 140, fourth semiconductor layer 160, and sixth semiconductor layer 180 can be removed using a selective isotropic etch, (e.g., wet chemical etch, dry plasma etch) to form lateral grooves 206 adjacent to the gate dielectric layers 210 of each of the gate structures. The first semiconductor layer 120 and third semiconductor layer 140 can be the same material so the portions can be removed simultaneously with the same etch. The fourth semiconductor layer 160 and sixth semiconductor layer 180 can be the same material, so the portions can be removed simultaneously with the same etch. The first, third, fourth, and sixth layers can all be the same material.

In various embodiments, the lateral grooves 206 can be about the same depth into the semiconductor layers as the lateral grooves 205 formed in second semiconductor layer 130 and fifth semiconductor layer 170, so the end face of the first semiconductor layer 120, third semiconductor layer 140, fourth semiconductor layer 160, and sixth semiconductor layer 180 can be co-planar with the interface between the gate dielectric layer 210 and the second semiconductor layer 130 and the fifth semiconductor layer 170.

Figure 5:
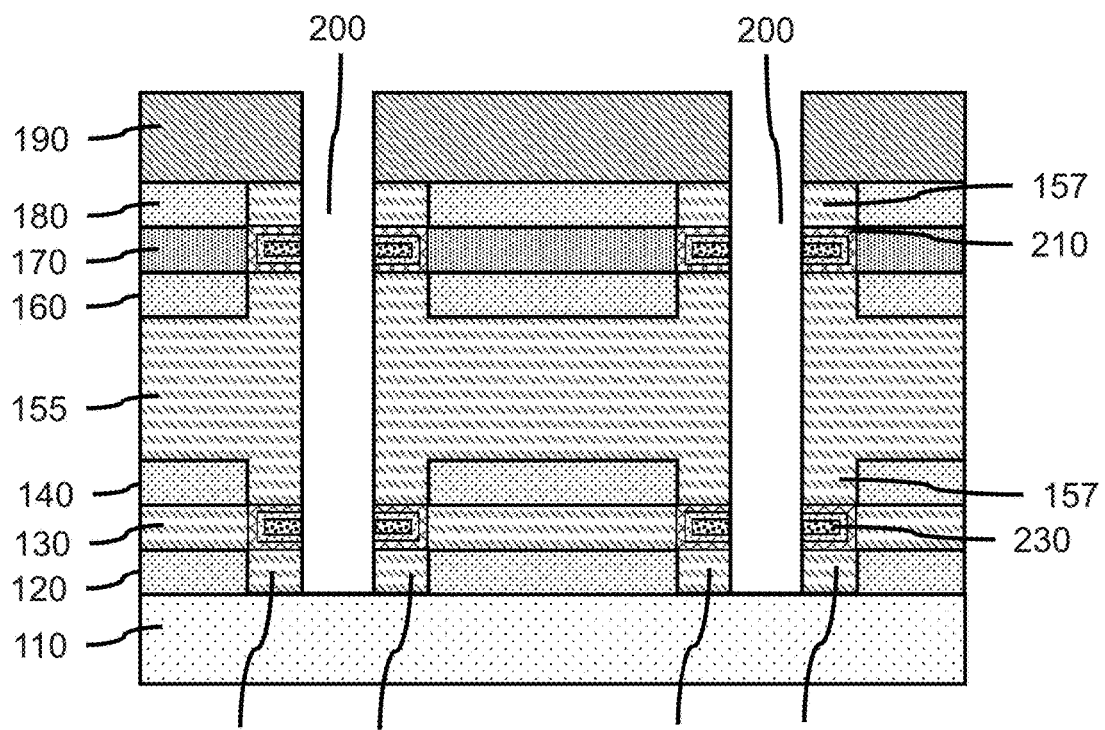
FIG. 5 is a cross-sectional side view showing a dielectric fill formed in the recessed semiconductor layers adjacent to the gate structures, in accordance with an embodiment of the present invention.

FIG. 5 is a cross-sectional side view showing a dielectric fill formed in the recessed semiconductor layers adjacent to the gate structures, in accordance with an embodiment of the present invention.

In one or more embodiments, a dielectric fill 157 can be formed in the lateral grooves 206 adjacent to the gate structures, where the dielectric fill can be the same material as insulating layer 155. The dielectric fills 157 can be an insulating, dielectric material, including, but not limited to, silicon oxide (SiO), silicon nitride (SiN), a silicon oxynitride (SiON), a silicon carbonitride (SiCN), a silicon boronitride (SiBN), a silicon borocarbide (SiBC), a low-K dielectric, or combinations thereof.

In various embodiments, the dielectric fill 157 can be formed using a conformal deposition (e.g., ALD, PEALD) and material formed on the gate structures and sidewalls of channel 200 can be removed using an isotropic etch and or directional etch (e.g., RIE) to each back the dielectric material not in grooves 206.

Figure 6:
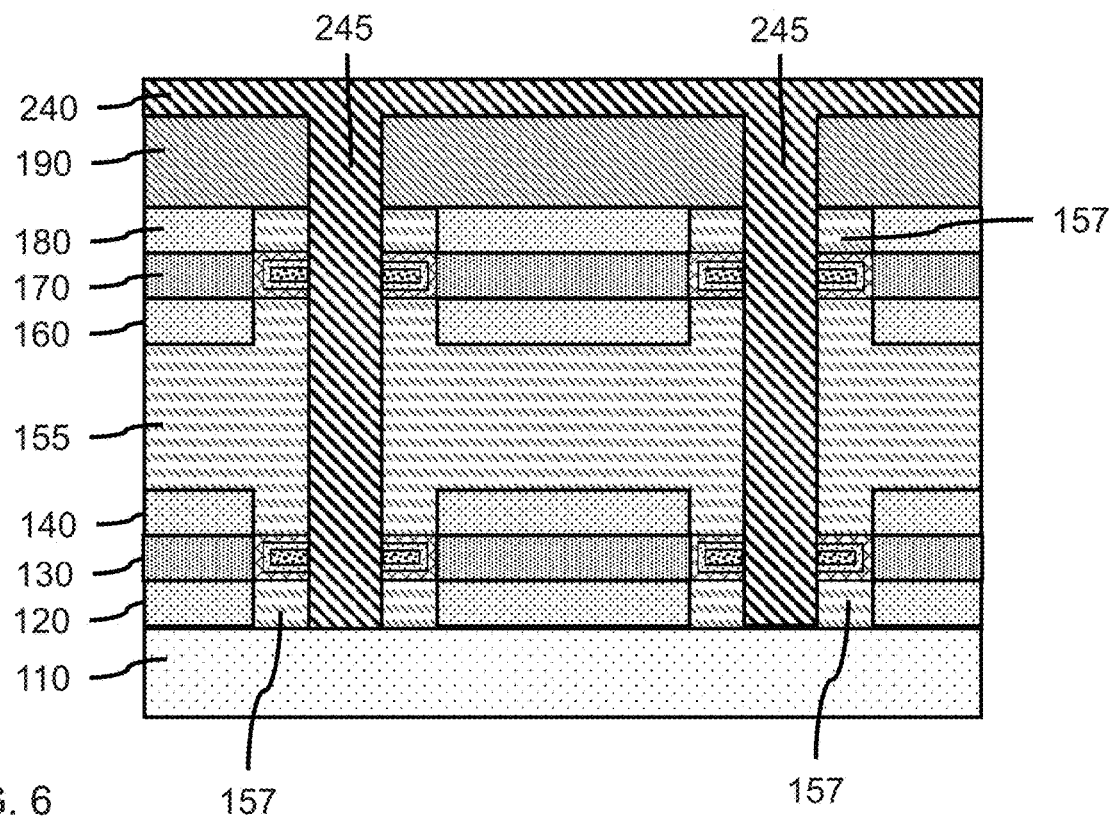
FIG. 6 is a cross-sectional side view showing the channels filled with a lithographic mask plug, in accordance with an embodiment of the present invention.

FIG. 6 is a cross-sectional side view showing the channels filled with a lithographic mask plug, in accordance with an embodiment of the present invention.

In one or more embodiments, a second lithographic mask layer 240 can be deposited on the first lithographic mask layer 190 to fill in each of the channels 200 with lithographic mask plugs 245. Material of the second lithographic mask layer 240 on the first lithographic mask layer 190 can be at least partially removed using a chemical-mechanical polishing (CMP) to provide a smooth, flat surface for lithography and patterning.

Figure 7:
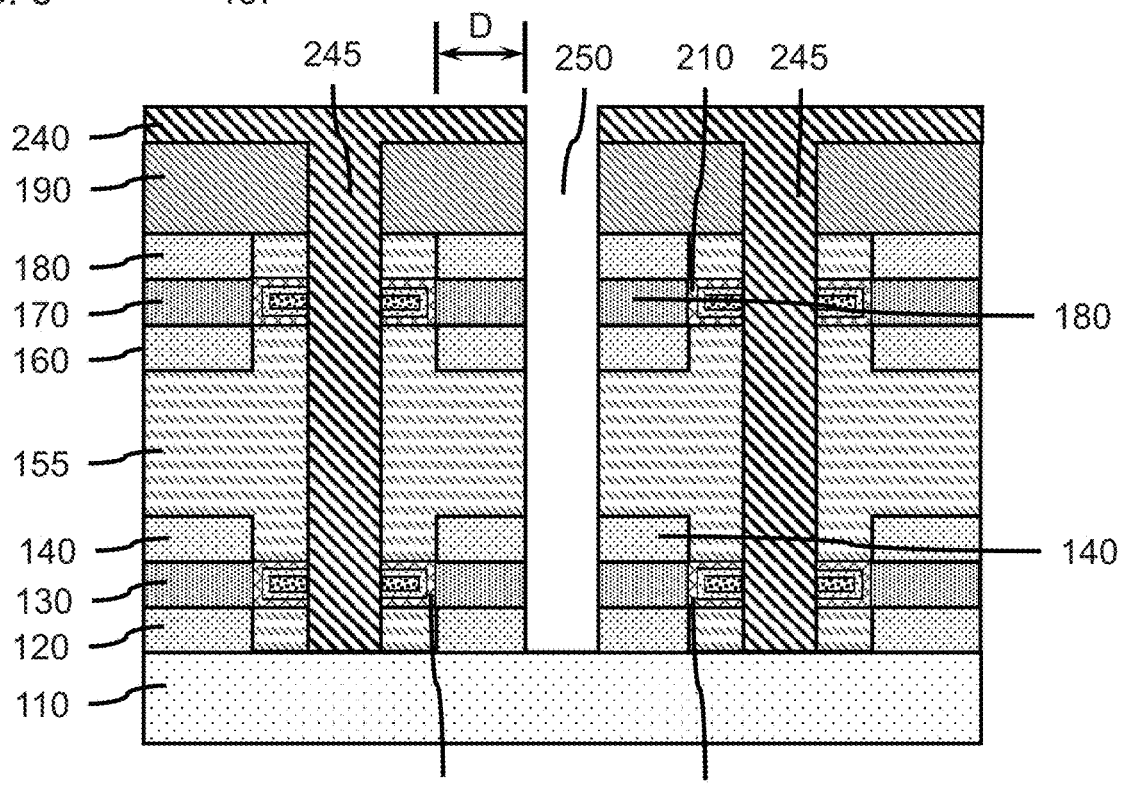
FIG. 7 is a cross-sectional side view showing an access trench formed in the first and second lithographic mask layers and semiconductor stack layers, in accordance with an embodiment of the present invention.

FIG. 7 is a cross-sectional side view showing an access trench formed in the first and second lithographic mask layers and semiconductor stack layers, in accordance with an embodiment of the present invention.

In one or more embodiments, one or more access trenches 250 can be formed in the second lithographic mask layer 240, first lithographic mask layer 190, sixth semiconductor layer 180, fifth semiconductor layer 170, and underlying layers 160, 150, 140, 130, 120, down to the top surface of the substrate 110. The access trenches 250 can be formed by a non-selective, directional etch, or sequential selective directional etches.

In one or more embodiments, the one or more trenches 250 can be formed a distance from each of the gate structures on the opposite side of a segment of the second semiconductor layer 130 and fifth semiconductor layer 170. The lateral distance, D, from the interface of the gate dielectric layer 210 with the adjoining portions of the second semiconductor layer 130 or fifth semiconductor layer 170 can be in the range of about 10 nm to about 100 nm, or about 20 nm to about 100 nm, or about 20 nm to about 60 nm, or about 30 nm to about 60 nm, although other distances are contemplated. The access trench 250 can be equidistant from each of the gate dielectric layer/semiconductor interfaces on the same semiconductor layer. The access trenches 250 can have sidewalls that expose each of the layers 190, 180, 170, 160, 150, 140, 130, 120 down to the substrate 110. The lateral distance, D, from the interface of the gate dielectric layer 210 can determine the width of segments of the layers 180, 170, 160, 150, 140, 130, 120 forming source/drains and device channels.

In one or more embodiments, access trenches 250 can have a width in a range of about 10 nm to about 30 nm, or about 15 nm to about 25 nm, although other widths are contemplated.

In one or more embodiments, access trenches 250 can have a length in a range of about 10 nm to about 100 nm, or about 40 nm to about 75 nm, although other lengths are contemplated.

Figure 8:
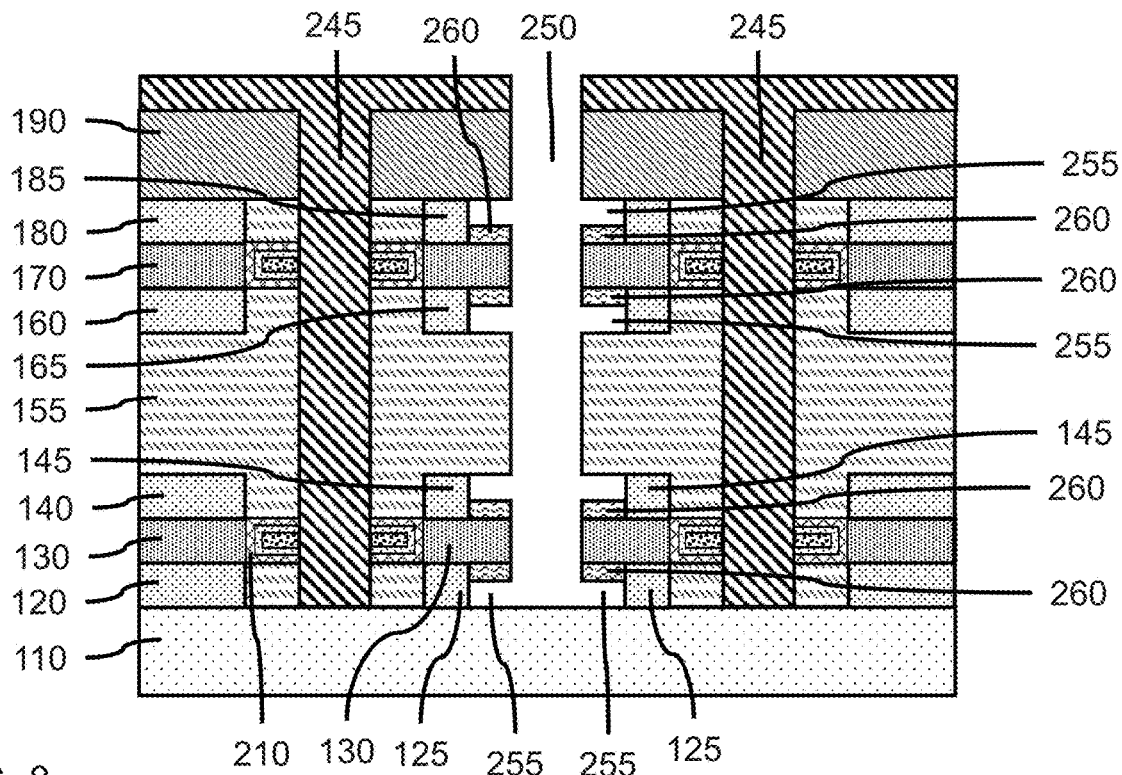
FIG. 8 is a cross-sectional side view showing removal of exposed portions of some of the semiconductor layers, and formation of spacers on the second and fifth semiconductor layers using selective growth, in accordance with an embodiment of the present invention.

FIG. 8 is a cross-sectional side view showing removal of exposed portions of some of the semiconductor layers, and formation of spacers on the second and fifth semiconductor layers using selective growth, in accordance with an embodiment of the present invention.

In one or more embodiments, portions of the first semiconductor layer 120, third semiconductor layer 140, fourth semiconductor layer 160, and sixth semiconductor layer 180 can be removed using a selective isotropic etch, (e.g., wet chemical etch, dry plasma etch) to form lateral grooves 255 spaced apart from the gate dielectric layers 210 of each of the gate structures. A portion of the first semiconductor layer 120, third semiconductor layer 140, fourth semiconductor layer 160, and sixth semiconductor layer 180 can remain between the lateral grooves 255 and the gate structures to form first semiconductor layer sections 125, third semiconductor layer sections 145, fourth semiconductor layer sections 165, and sixth semiconductor layer sections 185. The first semiconductor layer 120 and third semiconductor layer 140 can be the same material, so the portions can be removed simultaneously with the same etch. The fourth semiconductor layer 160 and sixth semiconductor layer 180 can be the same material, so the portions can be removed simultaneously with the same etch. The semiconductor layer sections 125, 145, 165, 185, can be the same material.

In various embodiments, the lateral grooves 255 can have a depth in a range of about 10 nm to about 30 nm, although other depths are contemplated. The lateral grooves 255 can have a depth less than the distance, D, such that a semiconductor layer section 125, 145, 165, 185 remains above and/or below the second semiconductor layer 130 and fifth semiconductor layer 170.

In one or more embodiments, a spacer 260 can be formed on opposite sides of the second semiconductor layer 130 and fifth semiconductor layer 170, where the spacer 260 can be formed by a selective oxidation of the exposed sides of the second semiconductor layer 130 and fifth semiconductor layer 170. The spacers 260 can have a thickness in a range of about 1 nm to about 10 nm, or about 2 nm to about 5 nm, where the thickness can be less than or equal to a third (⅓) of the thickness of the second semiconductor layer 130 or fifth semiconductor layer 170. Portions of oxidized second semiconductor layer 130 and fifth semiconductor layer 170 in the access trenches 250 can be removed using a directional etch (e.g., RIE). The oxidation process can be selective for semiconductor layers 130, 170 having a higher germanium concentration over semiconductor layers 120, 140, 160, 180.

Figure 9:
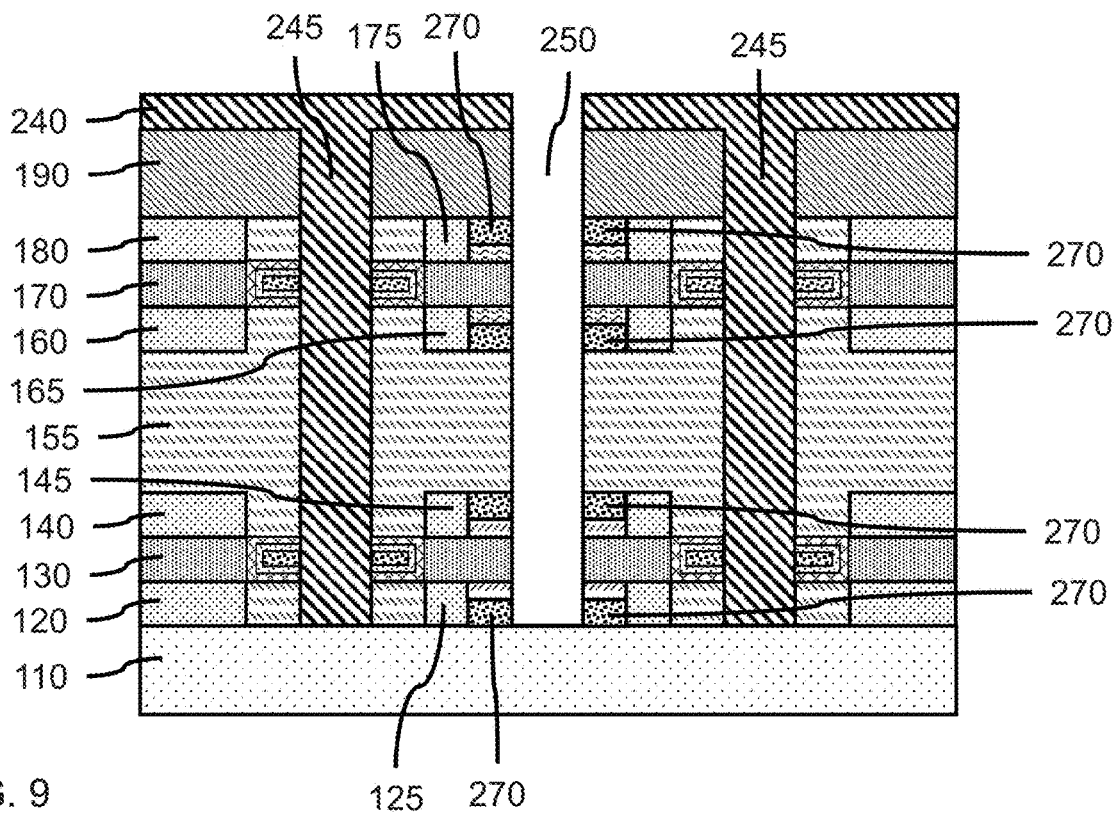
FIG. 9 is a cross-sectional side view showing contact slabs formed on the spacers, in accordance with an embodiment of the present invention.

FIG. 9 is a cross-sectional side view showing contact slabs formed on the spacers, in accordance with an embodiment of the present invention.

In one or more embodiments, a contact slab 270 can be formed on the spacers 260 in the remaining portion of the lateral grooves 255, where the contact slab 270 can be formed by a conformal deposition (e.g., ALD, PEALD) and/or MOCVD. An etch back can be used to remove materials from the access trench 250.

In one or more embodiments, the contact slab 270 can be made of a conductive material, which can be a metal, for example, tungsten (W), copper (Cu), cobalt (Co), tantalum (Ta), titanium (Ti), manganese (Mn); a conductive metal compound, for example, tantalum nitride (TaN), titanium nitride (TiN), titanium carbide (TiC), a copper manganese alloy (Cu—Mn), or any suitable combination thereof.

Figure 10:
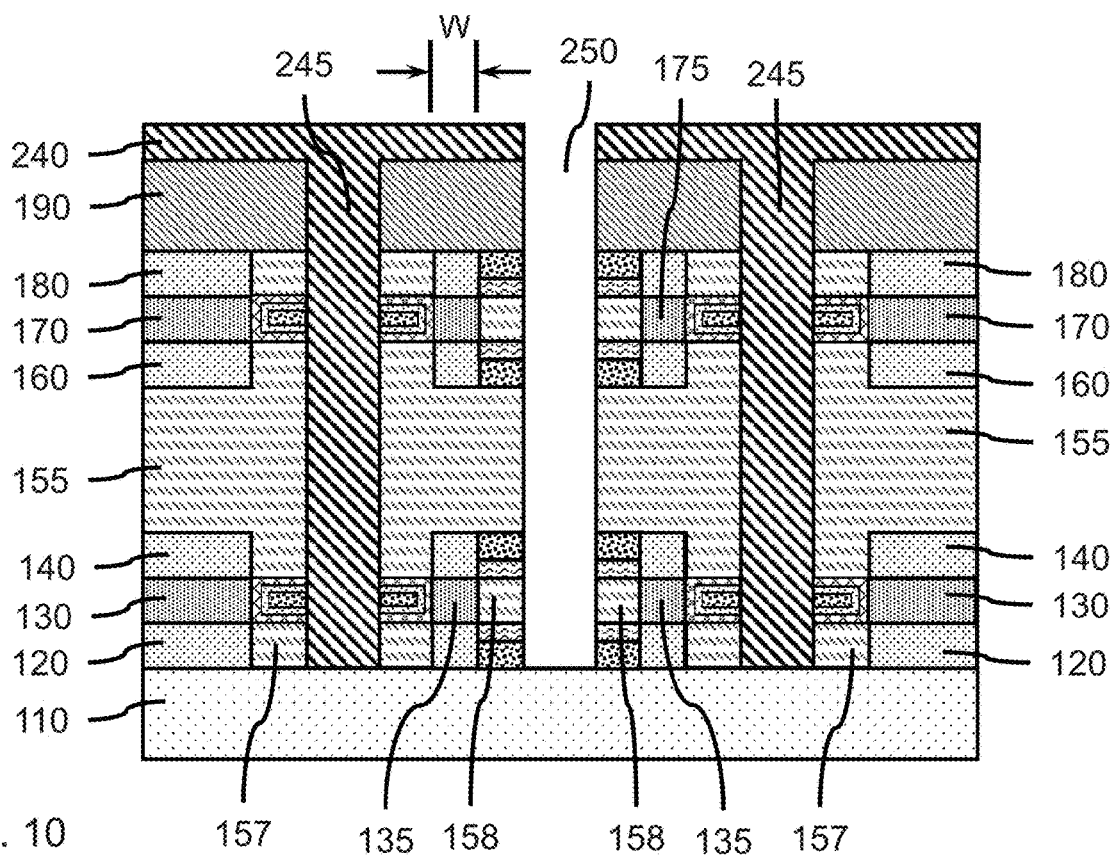
FIG. 10 is a cross-sectional side view showing portions of the second semiconductor layer and fifth semiconductor layer replaced with a dielectric fill, in accordance with an embodiment of the present invention.

FIG. 10 is a cross-sectional side view showing portions of the second semiconductor layer and fifth semiconductor layer replaced with a dielectric fill, in accordance with an embodiment of the present invention.

In one or more embodiments, a portion of the second semiconductor layer 130 and fifth semiconductor layer 170 exposed by the access trench 250 can be removed using a selective etch to form a second semiconductor layer section 135 and fifth semiconductor layer section 175.

In one or more embodiments, the first semiconductor layer sections 125, second semiconductor layer section 135, third semiconductor layer sections 145, fourth semiconductor layer sections 165, fifth semiconductor layer sections 175, and sixth semiconductor layer sections 185 can have a width in a range of about 10 nm to about 100 nm minus the depth of the lateral grooves 255 in a range of about 10 nm to about 30 nm.

In various embodiments, the first semiconductor layer sections 125, second semiconductor layer section 135, third semiconductor layer sections 145, fourth semiconductor layer sections 165, fifth semiconductor layer sections 175, and sixth semiconductor layer sections 185 can have a width, W, in a range of about 10 nm to about 90 nm, or in a range of about 10 nm to about 70 nm, or in a range of about 10 nm to about 30 nm, although other widths are contemplated.

In various embodiments, a dielectric plug 158 can be formed in the spaces created by removing the portions of the second semiconductor layer 130 and fifth semiconductor layer 170.

In one or more embodiments, the dielectric plugs 158 can be an insulating, dielectric material, including, but not limited to, silicon oxide (SiO), silicon nitride (SiN), a silicon oxynitride (SiON), a silicon carbonitride (SiCN), a silicon boronitride (SiBN), a silicon borocarbide (SiBC), a low-K dielectric, or combinations thereof. The dielectric plugs 158 can be the same material as insulating layer 155 and dielectric fills 157.

In various embodiments, the dielectric plug 158 can be formed using a conformal deposition (e.g., ALD, PEALD).

In various embodiments, the fourth semiconductor layer sections 165, fifth semiconductor layer sections 175, and sixth semiconductor layer sections 185 adjacent to an upper gate structure can form an upper VT FET segment, and the first semiconductor layer sections 125, second semiconductor layer section 135, third semiconductor layer sections 145 adjacent to a lower gate structure can form a lower VT FET segment.

Figure 11:
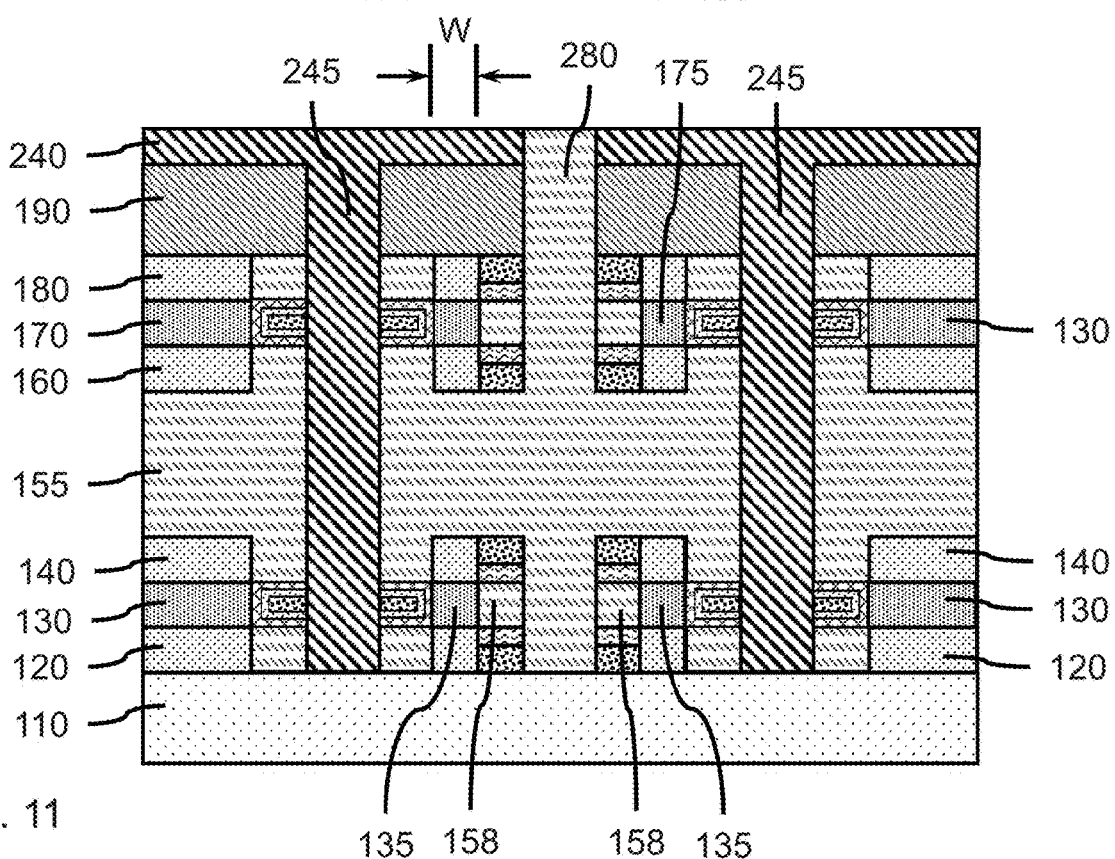
FIG. 11 is a cross-sectional side view showing the access trench filled with a dielectric column, in accordance with an embodiment of the present invention.

FIG. 11 is a cross-sectional side view showing the access trench filled with a dielectric column, in accordance with an embodiment of the present invention.

In one or more embodiments, a dielectric column 280 can be formed in the access trench 250, where the dielectric column 280 can be the same material as insulating layer 155, dielectric plug 158, and dielectric fill 157. The dielectric column 280 can be an insulating, dielectric material, including, but not limited to, silicon oxide (SiO), silicon nitride (SiN), a silicon oxynitride (SiON), a silicon carbonitride (SiCN), a silicon boronitride (SiBN), a silicon borocarbide (SiBC), a low-K dielectric, or combinations thereof. A CMP can be used to remove portions of the dielectric column 280 above the top surface of the second lithographic mask layer 240.

Figure 12:
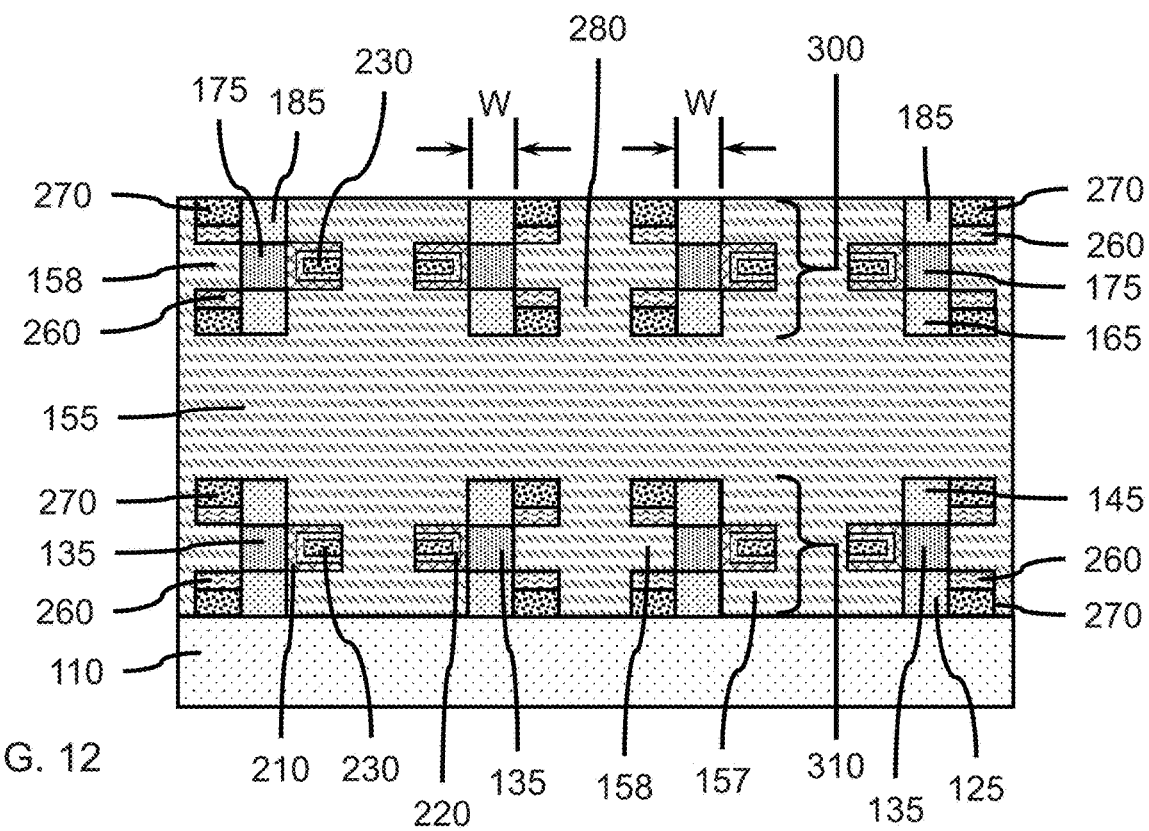
FIG. 12 is a cross-sectional side view showing a stacked arrangement of collinear vertical transport field effect devices, in accordance with an embodiment of the present invention.

FIG. 12 is a cross-sectional side view showing a stacked arrangement of collinear vertical transport field effect devices, in accordance with an embodiment of the present invention.

In one or more embodiments, a plurality of access trenches 250 can be formed to allow fabrication of multiple spacers 260, contact slabs 270, and upper VT FET segments 300, including, the fourth semiconductor layer sections 165, fifth semiconductor layer sections 175, and sixth semiconductor layer sections 185 adjacent to an upper gate structure, including, gate dielectric layer 210, work function layer 220, and gate fill layer 230.

In one or more embodiments, a plurality of access trenches 250 can be formed to allow fabrication of multiple spacers 260, contact slabs 270, and lower VT FET segments 310, including, the first semiconductor layer sections 125, second semiconductor layer sections 135, and third semiconductor layer sections 145 adjacent to a lower gate structure, including, gate dielectric layer 210, work function layer 220, and gate fill layer 230.

The combination of an upper VT FET segment 300 and a lower VT FET segment 310 can form a stacked arrangement of two vertical transport field effect transistors, where the fourth semiconductor layer section 165 and sixth semiconductor layer section 185 are doped to form top and bottom source/drains, and the fifth semiconductor layer section 175 forms a device channel of the upper VT FET segment 300. The first semiconductor layer section 125 and third semiconductor layer section 145 are doped to form top and bottom source/drains, and the second semiconductor layer section 135 forms a device channel of the lower VT FET segment 310.

The contact slabs 270 can form electrical connections to the top and bottom source/drains, and the gate fill layer 230 can electrically couple the gate structures of adjacent upper VT FET segments 300 together, and electrically couple the gate structures of adjacent lower VT FET segments 310 together to form the stacked arrangement of two vertical transport field effect transistors. The number of stacked vertical transport field effect transistors can be increased by forming additional semiconductor layers on the semiconductor layer stack to form additional VT FET segments above the upper VT FET segment 300.

The access trenches 250 can each be filled with dielectric column 280 that electrically isolates adjacent vertical transport field effect transistors. The lithographic mask plugs 245 can also be removed and filled with dielectric column 280.

Figure 13:
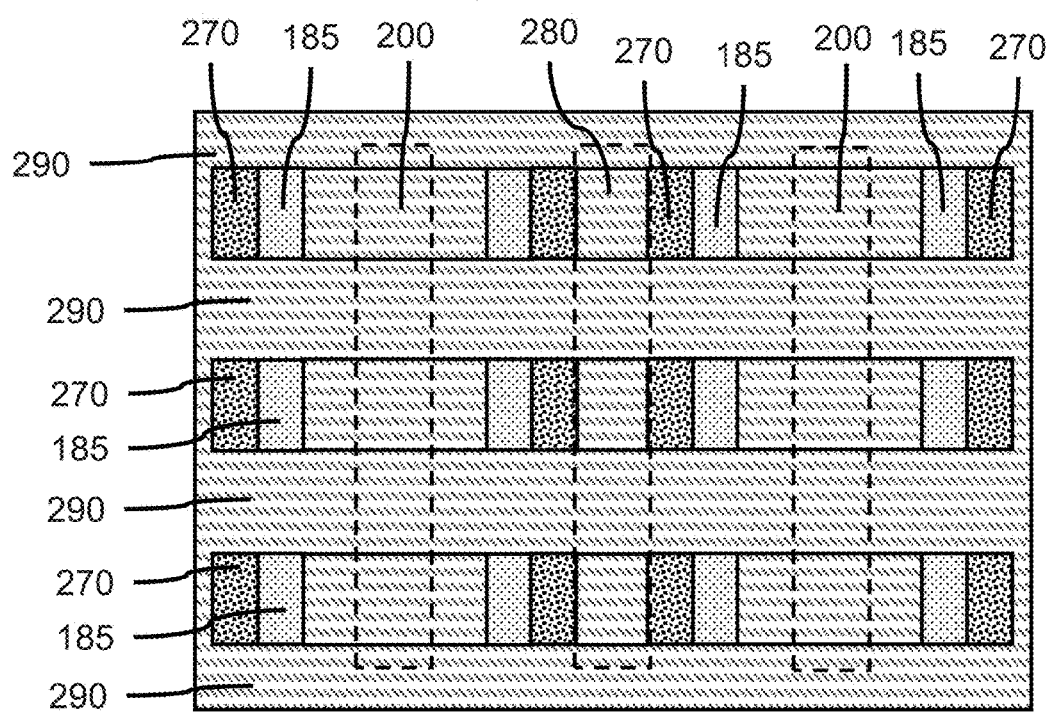
FIG. 13 is a top view showing an array of access trenches filled with dielectric columns adjacent to contact slabs and sixth semiconductor layer sections, in accordance with an embodiment of the present invention.

FIG. 13 is a top view showing an array of access trenches filled with dielectric columns adjacent to contact slabs and sixth semiconductor layer sections, in accordance with an embodiment of the present invention.

In various embodiments, the channels 200 and access trenches 250 can be arranged in an array (row×column) to form multiple stacked vertical transport field effect transistors. The size and positioning of the channels 200 and access trenches 250 can determine the sizes and spacing of the vertical transport field effect transistors.

In various embodiments, larger channels 200 and access trenches 250 can be cut into smaller sizes by masking and etching isolation trenches that intersect the channels 200 and access trenches 250. The isolation trenches 290 can electrically separate first semiconductor layer sections 125, second semiconductor layer section 135, third semiconductor layer sections 145, fourth semiconductor layer sections 165, fifth semiconductor layer sections 175, and sixth semiconductor layer sections 185 into shorter semiconductor layer sections, and remove portions of the semiconductor layers 120, 130,

140, 160, 170, 180 that would otherwise wrap around the ends of the channels 200 and access trenches 250 to electrically connect the semiconductor layer sections of adjacent upper VT FET segments 300 and lower VT FET segments 310 together. The isolation trenches 290 can also cut contact slabs 270 and gate structures to form separate devices.

The isolation trenches 290 can be filled with an insulating, dielectric material.

Figure 14:
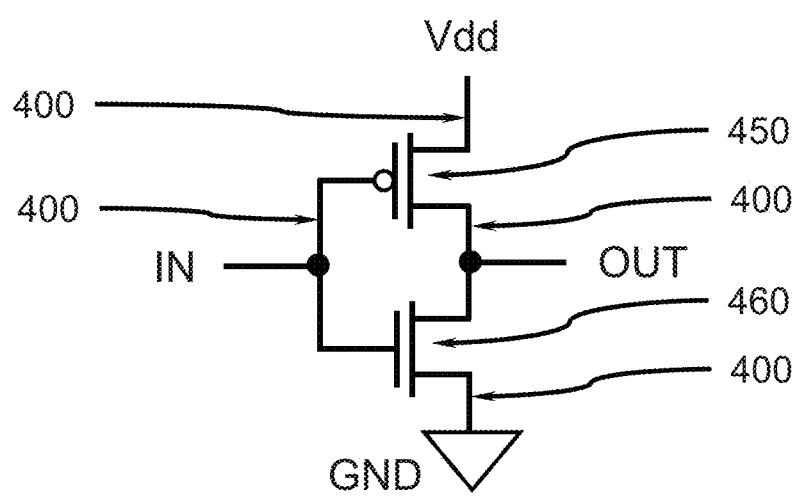
FIG. 14 is a schematic diagram showing a stacked device circuit, in accordance with an embodiment of the present invention.

FIG. 14 is a schematic diagram showing a stacked device circuit, in accordance with an embodiment of the present invention.

In one or more embodiments, a stacked arrangement of two or more vertical transport field effect transistors can be electrically coupled to form a CMOS circuit, an inverter circuit, a flip-flop, or an electrically erasable programmable read-only memory (EEPROM) circuit. The upper device 450 can be electrically coupled to the lower device 460 through the contact slabs 270 with conductive lines 400. The upper device 450 can be formed by an upper VT FET segment 300 and gate structure, and the lower device 460 can be formed by a lower VT FET segment 310 and gate structure. The lower contact slabs 270 can be electrically connected to ground (GND). The upper contact slabs 270 can be electrically connected to a drain voltage, Vdd. The fourth semiconductor layer sections 165 can be electrically connected to third semiconductor layer sections 145 to provide a signal out line (OUT). The gate fill layer 230 of the upper device and lower device can be electrically coupled and connected to a signal in line (IN).

Figure 15:
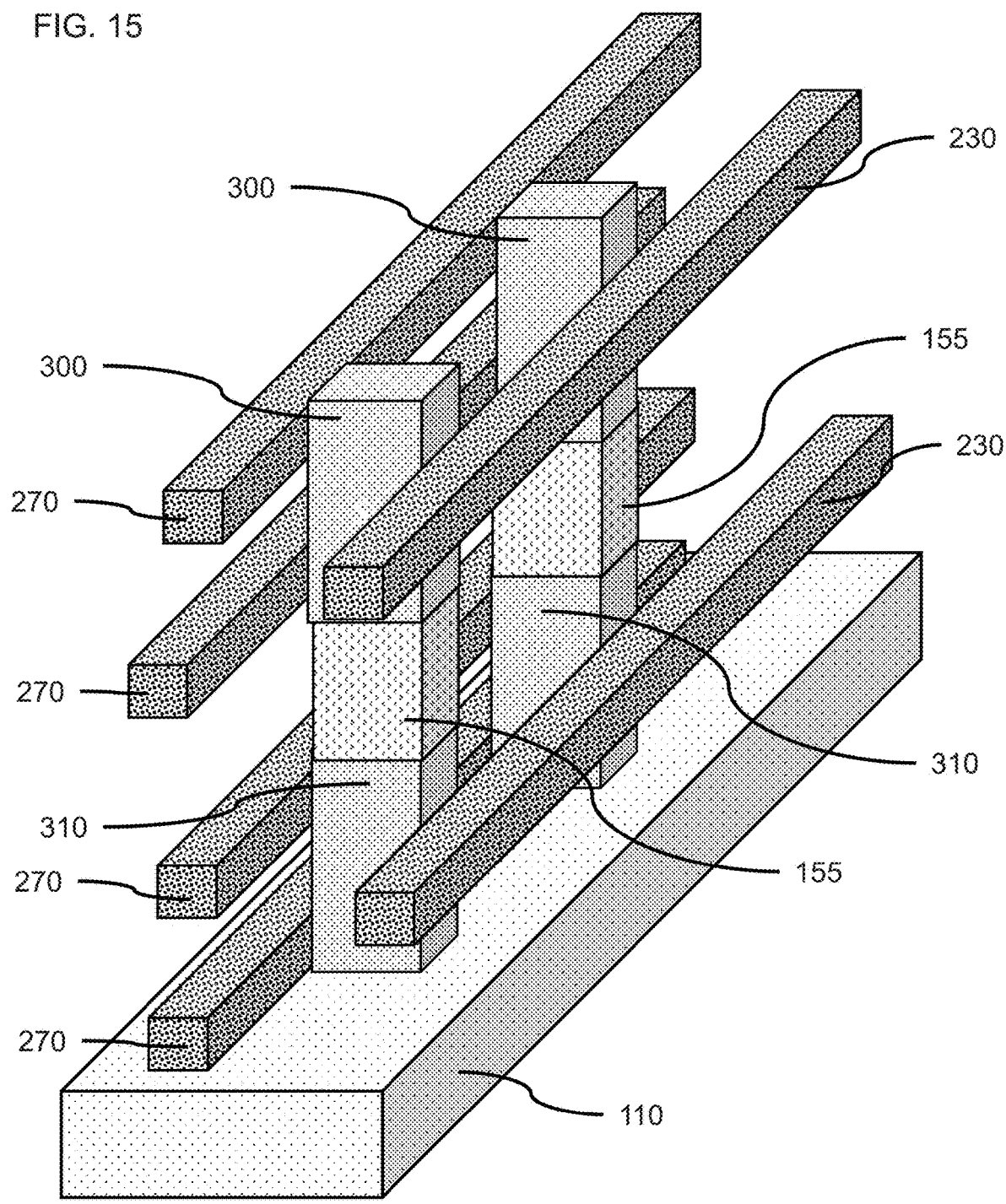
FIG. 15 is a three dimensional cut-away view showing conductive lines and source/drain contacts adjoining portions of stacked upper and lower vertical pillars, in accordance with an embodiment of the present invention.

FIG. 15 is a three dimensional cut-away view showing conductive lines and source/drain contacts adjoining portions of stacked upper and lower vertical fin segments, in accordance with an embodiment of the present invention.

In various embodiments, stacked upper and lower VT FET segments 300, 310 can be in electrical contact with the source/drain slabs 270. The gate fill layers 230 can couple the gates of adjacent VT FET segments together, and conductive lines can electrically connect the gate fill layers 230 to couple the gate structures of stacked devices together.

The upper device can be electrically coupled to the lower device through the source/drain slabs 270 with conductive lines parallel with the vertical pillars forming the upper and lower VT FET segments 300, 310.

The insulating layer 155 can electrically isolate the upper VT FET segment 300 and gate structure from the lower VT FET segment 310 and gate structure.

The upper vertical transport field effect transistor segment 300 and the lower vertical transport field effect transistor segment 310 can each have a height in a range of about 30 nm to about 70 nm. The upper vertical transport field effect transistor segment and the lower vertical transport field effect transistor segment can have a width, W, in a range of about 10 nm to about 90 nm. The vertical distance between the upper vertical transport field effect transistor segment and the lower vertical transport field effect transistor segment occupied by the insulating layer 155 can be in a range of about 20 nm to about 50 nm.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising" "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A stacked device circuit, comprising:
   a first semiconductor layer section on a substrate;
   a dielectric fill on the substrate adjoining the first semiconductor layer section;
   a second semiconductor layer section on the first semiconductor layer section;
   a lower gate structure on the dielectric fill and adjoining the second semiconductor layer section;
   a third semiconductor layer section on the second semiconductor layer section; and
   an insulating layer on the third semiconductor layer section and lower gate structure.

2. The stacked device circuit of claim 1, further comprising a fourth semiconductor layer section on the insulating layer.

3. The stacked device circuit of claim 2, further comprising a first contact slab in electrical contact with the first semiconductor layer section, and a second contact slab in electrical contact with the third semiconductor layer section.

4. The stacked device circuit of claim 3, further comprising a fifth semiconductor layer section on the fourth semiconductor layer section and a sixth semiconductor layer section on the fifth semiconductor layer section.

5. The stacked device circuit of claim 4, further comprising a third contact slab in electrical contact with the fourth semiconductor layer section, and a fourth contact slab in electrical contact with the sixth semiconductor layer section.

6. The stacked field effect device of claim 5, wherein the first semiconductor layer section, second semiconductor layer section, and the third semiconductor layer section has a combined height in a range of about 30 nm to about 70 nm.

7. The stacked field effect device of claim 6, wherein the first semiconductor layer section has a thickness in a range of about 10 nanometers (nm) to about 20 nm, the second semiconductor layer section has a thickness in a range of about 10 nm to about 30 nm, and the third semiconductor layer section has a thickness in a range of about 10 nm to about 20 nm.

8. The stacked field effect device of claim 7, wherein the insulating layer has a thickness between the fourth semiconductor layer section and the third semiconductor layer section in a range of about 20 nm to about 50 nm.

9. The stacked field effect device of claim 8, wherein the first semiconductor layer section, second semiconductor layer section, and third semiconductor layer section, are silicon-germanium (SiGe), and wherein the first semiconductor layer section and third semiconductor layer section have a lower germanium concentration than the second semiconductor layer section.

10. A stacked device circuit, comprising:
    a first semiconductor layer section on a substrate;
    a dielectric fill on the substrate adjoining the first semiconductor layer section;
    a second semiconductor layer section on the first semiconductor layer section;
    a lower gate structure on the dielectric fill and adjoining the second semiconductor layer section;
    a third semiconductor layer section on the second semiconductor layer section;
    an insulating layer on the third semiconductor layer section and lower gate structure;
    a fourth semiconductor layer section on the insulating layer;
    a fifth semiconductor layer section on the fourth semiconductor layer section; and
    a sixth semiconductor layer section on the fifth semiconductor layer section, wherein the fourth, fifth, and sixth semiconductor layer sections are colinear with the first, second, and third semiconductor layer sections.

11. The stacked device circuit of claim 10, wherein the first semiconductor layer section, second semiconductor layer section, third semiconductor layer section, fourth semiconductor layer section, fifth semiconductor layer section, and sixth semiconductor layer section are silicon-germanium (SiGe), and wherein the first semiconductor layer section, third semiconductor layer section, fourth semiconductor layer section, and sixth semiconductor layer section have a lower germanium concentration than the second semiconductor layer section and fifth semiconductor layer section.

12. The stacked device circuit of claim 11, further comprising an upper gate structure adjoining the fifth semiconductor layer section and the insulating layer.

13. The stacked device circuit of claim 12, wherein the first semiconductor layer section has a thickness in a range of about 10 nanometers (nm) to about 20 nm, the second semiconductor layer section has a thickness in a range of about 10 nm to about 30 nm, and the third semiconductor layer section has a thickness in a range of about 10 nm to about 20 nm.

14. The stacked device circuit of claim 13, further comprising a contact slab adjoining the sixth semiconductor layer section.

15. The stacked device circuit of claim 14, wherein the fourth semiconductor layer section and sixth semiconductor layer section are doped to form top and bottom source/drains, and the fifth semiconductor layer section forms a device channel of an upper vertical transport field effect transistor segment.

16. A stacked device circuit, comprising:
a first semiconductor layer section on a substrate;
a dielectric fill on the substrate adjoining the first semiconductor layer section;
a second semiconductor layer section on the first semiconductor layer section;
a lower gate structure on the dielectric fill and adjoining the second semiconductor layer section;
a third semiconductor layer section on the second semiconductor layer section;
an insulating layer on the third semiconductor layer section and lower gate structure; and
a fourth semiconductor layer section on the insulating layer, wherein the fourth semiconductor layer section is vertically stacked above and colinear with the first semiconductor layer section, second semiconductor layer section, and third semiconductor layer section.

17. The stacked device circuit of claim 16, wherein the first semiconductor layer section, second semiconductor layer section, and third semiconductor layer section have the same width, W, in a range of about 10 nm to about 90 nm.

18. The stacked device circuit of claim 17, further comprising a fifth semiconductor layer section on the fourth semiconductor layer section; and
a sixth semiconductor layer section on the fifth semiconductor layer section, wherein the fourth, fifth, and sixth semiconductor layer sections are colinear with the first, second, and third semiconductor layer sections.

19. The stacked device circuit of claim 18, an upper gate structure on the insulating layer and adjoining the fifth semiconductor layer section.

20. The stacked device circuit of claim 19, wherein the lower gate structure is electrically connected to the upper gate structure.

* * * * *